(12) United States Patent
Takano

(10) Patent No.: US 7,233,067 B2
(45) Date of Patent: Jun. 19, 2007

(54) MANUFACTURING A BUMP ELECTRODE WITH ROUGHENED FACE

(75) Inventor: Michiyoshi Takano, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/988,553

(22) Filed: Nov. 16, 2004

(65) Prior Publication Data

US 2005/0062158 A1    Mar. 24, 2005

Related U.S. Application Data

(62) Division of application No. 10/445,188, filed on May 27, 2003, now Pat. No. 6,872,651, and a division of application No. 09/714,944, filed on Nov. 20, 2000, now abandoned.

(30) Foreign Application Priority Data

Nov. 18, 1999 (JP) ................ 11-328467

(51) Int. Cl.
    *H01L 29/43* (2006.01)
(52) U.S. Cl. ...................... 257/737; 257/739
(58) Field of Classification Search ................ 257/737, 257/739
    See application file for complete search history.

(56) References Cited

U.S. PATENT DOCUMENTS

| | | | |
|---|---|---|---|
| 4,786,545 A * | 11/1988 | Sakuma et al. | ............. 428/209 |
| 5,108,950 A | 4/1992 | Wakabayashi et al. | |
| 5,487,999 A | 1/1996 | Farnworth | |
| 5,545,589 A | 8/1996 | Tomura et al. | |
| 6,084,301 A | 7/2000 | Chang et al. | |
| 6,109,507 A | 8/2000 | Yogi et al. | |
| 6,165,820 A | 12/2000 | Pace | |
| 6,406,991 B2 | 6/2002 | Sugihara | |
| 6,742,701 B2 * | 6/2004 | Furuno et al. | ............... 228/205 |

FOREIGN PATENT DOCUMENTS

| | | |
|---|---|---|
| JP | A-1-136354 | 5/1989 |
| JP | A-8-70019 | 3/1996 |
| JP | A-11-111761 | 4/1999 |

* cited by examiner

*Primary Examiner*—Leonardo Andujar
(74) *Attorney, Agent, or Firm*—Oliff & Berridge, PLC

(57) ABSTRACT

The invention includes a semiconductor device, and a method for making the same, wherein bumps of a semiconductor chip and inner leads of a film tape carrier can be securely bonded to each other by thermal welding using a heating unit. A semiconductor wafer is etched using a potassium iodide or ammonium iodide solution. By the etching, a barrier metal layer is removed while the upper face of a bump is simultaneously roughened and many prominences are formed. The formation of the prominences increases the surface area of the upper face of the bump 10 and improves the bonding between the bump of the semiconductor chip and the lead of the film tape carrier.

8 Claims, 4 Drawing Sheets

(1)

(2)

| 1. BUMP SURFACE ROUGHNESS (μm) | 0 TO LESS THAN 1 | 1 TO LESS THAN 5 | 5 OR MORE |
|---|---|---|---|
| 2. Au/Sn EUTECTIC ALLOY | X | O | △ |
| 3. BONDING STRENGTH | X | O | △ |
| 4. COMPREHENSIVE DETERMINATION | X | O | △ |

(1)

PRIOR ART

(2)

PRIOR ART

MANUFACTURING A BUMP ELECTRODE WITH ROUGHENED FACE

This is a Divisional of application Ser. No. 10/445,188 filed May 27, 2003 now U.S. Pat. No. 6,872,651, which is a Divisional of application Ser. No. 09/714,944 filed Nov. 20, 2003 now abandoned. The entire disclosure of the prior applications is hereby incorporated by reference herein in its entirety.

BACKGROUND OF THE INVENTION

1. Field of Invention

The present invention relates to a semiconductor device and a method for making the same, and particularly to a semiconductor chip mounted onto a tape substrate.

2. Description of Related Art

In the field of semiconductor devices, tape carrier packages (TCPs) are well known as one type of bare-chip-mounted packages. FIG. 5 is a schematic view of a film tape carrier. As shown in FIG. 5, the film tape carrier 30 is generally formed by laminating a copper foil onto a polyimide resin film, forming a circuit onto the copper foil, and plating thereon using Sn or Au, as an oblong product before the product is processed together with semiconductor devices. The lead comprises inner leads 20 bonded to an Au bump formed on an electrode pad of the semiconductor chip, and outer leads 36 integratedly formed with the inner leads 20 and used for connection to an exterior.

A method for making a TCP by a gang bonding process which simultaneously bonds all bumps to inner leads will now be described with reference to FIG. 6. A semiconductor chip is placed in a position surrounded by a device hole 32 on a stage (not shown in the drawing), and each bump of the semiconductor chip and the corresponding inner lead are aligned so that they are exactly bonded to each other. As shown in FIG. 6(1), a heating unit 52, which is preliminarily heated to about 500° C., is lowered toward the bumps and the inner leads 20 so that the heating unit 52 presses the bumps and the inner leads 20 on the stage.

The heat from the heating unit facilitates the formation of an Au/Sn eutectic alloy 46 shown in FIG. 6(2) by alloying the Au and the Sn plated on the inner leads 20. The mounting of the semiconductor chip 40 onto the film tape carrier 30 is completed by bonding the bumps to the inner leads 20 via the eutectic alloy 46. Next, unnecessary portions of the film tape carrier 30 are removed by punching to prepare a TCP.

However, the bonding of the bumps to the inner leads of the semiconductor chip using the heating unit has the following problems.

FIG. 4 is a schematic view showing a problem which occurs during mounting a semiconductor chip by a conventional technique. As shown in FIG. 4, a bump 10 is formed on an electrode pad 42 of a semiconductor chip 40. Since the periphery of the electrode pad 42 is covered by a passivation film 44 and protrudes, the bump 10 formed on the passivation film 44 also protrudes at the periphery and has an indented flat surface in the central portion. When the inner lead 20 is put into contact with the bump 10, a gap 18 is formed between the bump 10 and the inner lead 20 due to the protrusion. Thus, the central portion of the bump 10 does not contribute to the bonding of the bump 10 to the inner lead 20, in this state.

With reference to FIG. 6(2), in conventional thermal welding between the bump 10 and the inner lead 20, a high load and a high temperature are applied by the heating unit so that the Au/Sn eutectic alloy 46 is also formed in the central portion of the bump 10.

However, the application of the high load and the high temperature causes deforming and cracking of the inner lead and cracking of the passivation film. Such phenomena result in unreliability of the semiconductor devices as a product. Other problems, such as gas evolution from the film tape carrier and a shortened life of the heating unit, also arise.

Accordingly, it is an object of the present invention to provide a semiconductor device and a method for making the same in which bumps of a semiconductor chip and leads of a tape substrate can be securely bonded to each other by thermal welding using a heating unit.

SUMMARY OF THE INVENTION

The present invention includes a semiconductor device that includes a tape substrate provided with a lead, and a semiconductor chip mounted onto the tape substrate by thermal welding a bump formed on an active face of the semiconductor chip with the lead. The upper face of the bump is roughened.

In the present invention having such a configuration, the upper face of the bump is roughened so that the surface area increases compared to a case of a flat upper face of the bump. Thus, the area contributing to the formation of an Au/Sn eutectic alloy increases and the melted eutectic alloy penetrates the gap between prominences by a capillary phenomenon, ensuring bonding between the bump and the lead. Thus, high load and high temperature are not required for bonding, and the occurrence of inner lead cracking can be prevented.

In accordance with the above semiconductor device, prominences having a height of 1 to 5 μm are continuously formed on the upper face of the bump.

In the present invention having such a configuration, the height of the prominences formed by roughening the upper face of the bump is controlled within a range which increases the surface area of the upper face of the bump so as to contribute to the formation of the Au/Sn eutectic alloy and to ensure sufficient bonding strength between the bump and the lead. Thus, thermal welding between the bump and the lead are ensured.

It is preferable that the heights of the prominences on the upper face of the bump be the same so that the prominences securely come into contact with the lead to facilitate the formation of the Au/Sn eutectic alloy between the prominences and the lead.

A method for making a semiconductor device that includes a tape substrate provided with a lead, and a semiconductor chip mounted onto the tape substrate by thermal welding a bump formed on an active face of the semiconductor chip with the lead, includes the steps of roughening the upper face of the bump, and thermally welding the bump to the lead.

In the present invention having such a configuration, the bump and the lead are thermally welded after the upper face of the bump is roughened. Thus, the surface area can be increased compared to a case of a flat upper face of the bump. Thus, reliability of bonding between the bump and the lead can be enhanced.

In accordance with the above method for making a semiconductor device, the step for roughening is performed while a barrier metal formed on a semiconductor wafer provided with the semiconductor chip is simultaneously removed.

In the present invention having a such a configuration, the roughening step and the step for removing the barrier metal in the wafer process are simultaneously performed, and no additional process is required for roughening.

In accordance with the method for making a semiconductor device, the roughening treatment is performed by etching the upper face of the bump with an iodide compound.

In the present invention having a such a configuration, soft etching of the upper face of the bump is facilitated.

In accordance with the method for making a semiconductor device, the iodine compound is potassium iodide or ammonium iodide.

In the present invention having such a configuration, desired projections can be readily formed on the upper face of the bump.

DETAILED DESCRIPTION OF PREFERRED EMBODIMENTS

Figure 1:
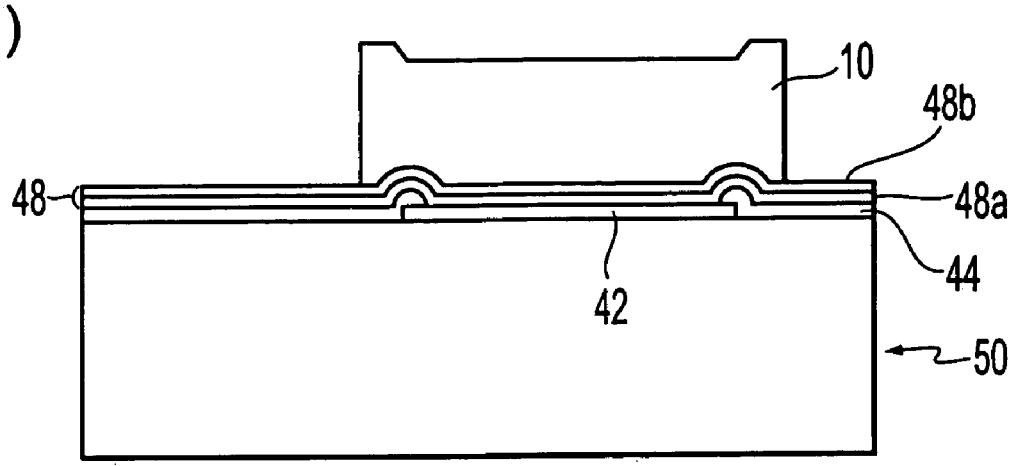
FIG. 1 includes illustrative views of a method for making a semiconductor device in accordance with an embodiment of the present invention, wherein FIG. 1(1) is an illustrative view of the semiconductor chip before roughening a bump of a semiconductor chip, and FIG. 1(2) is an illustrative view after roughening.
Figure 1:
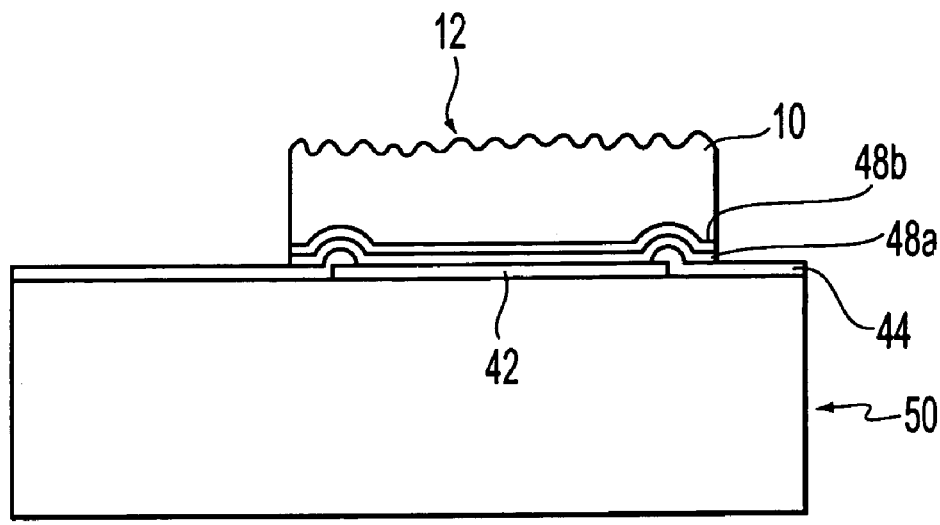

The semiconductor device and the method for making the same in accordance with the present invention will now be described in detail based on the preferred embodiments with reference to the attached drawings. Parts corresponding to the parts described in the above conventional technology are referred to as the same reference numerals, and the description for these parts will be omitted. Moreover, descriptions, which are the same as those in the above conventional technology, will be simplified.

Figures 2, 3:
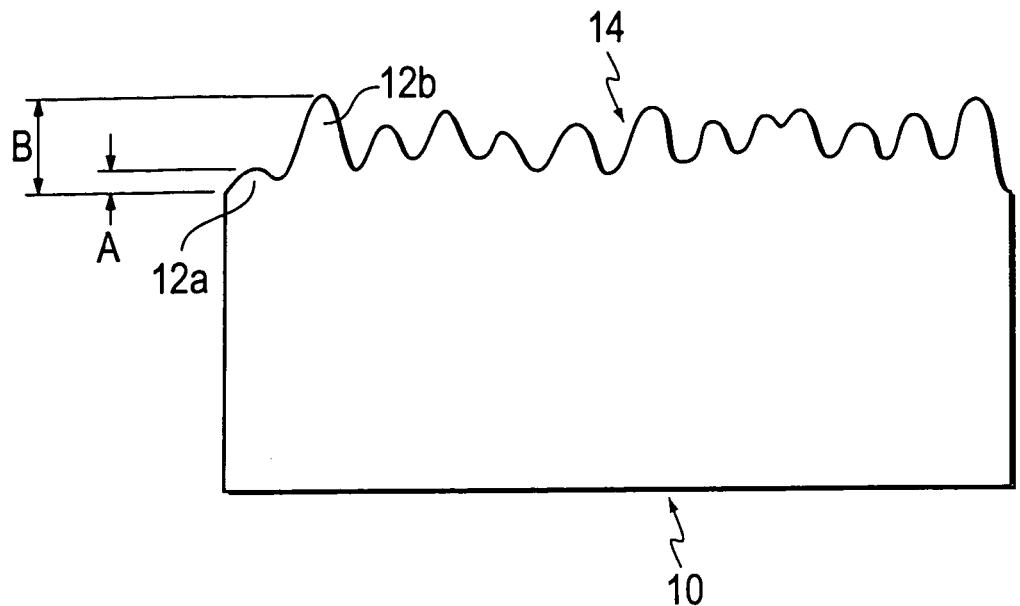
FIG. 2 is an illustrative view of a bump after roughening treatment.
FIG. 3 is an illustrative chart showing the relationship between the height of the prominence and the bonding strength of the bump and the inner lead.
Figure 4:
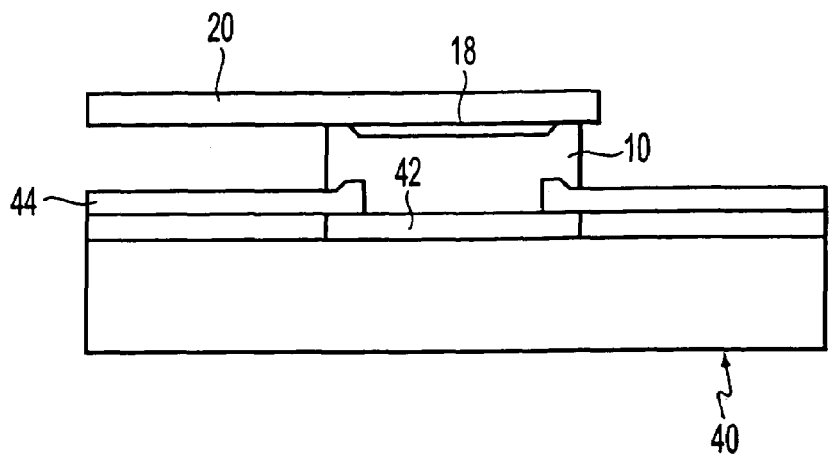
FIG. 4 is a schematic view showing a problem which occurs during mounting of a semiconductor chip by a conventional technique.
Figure 5:
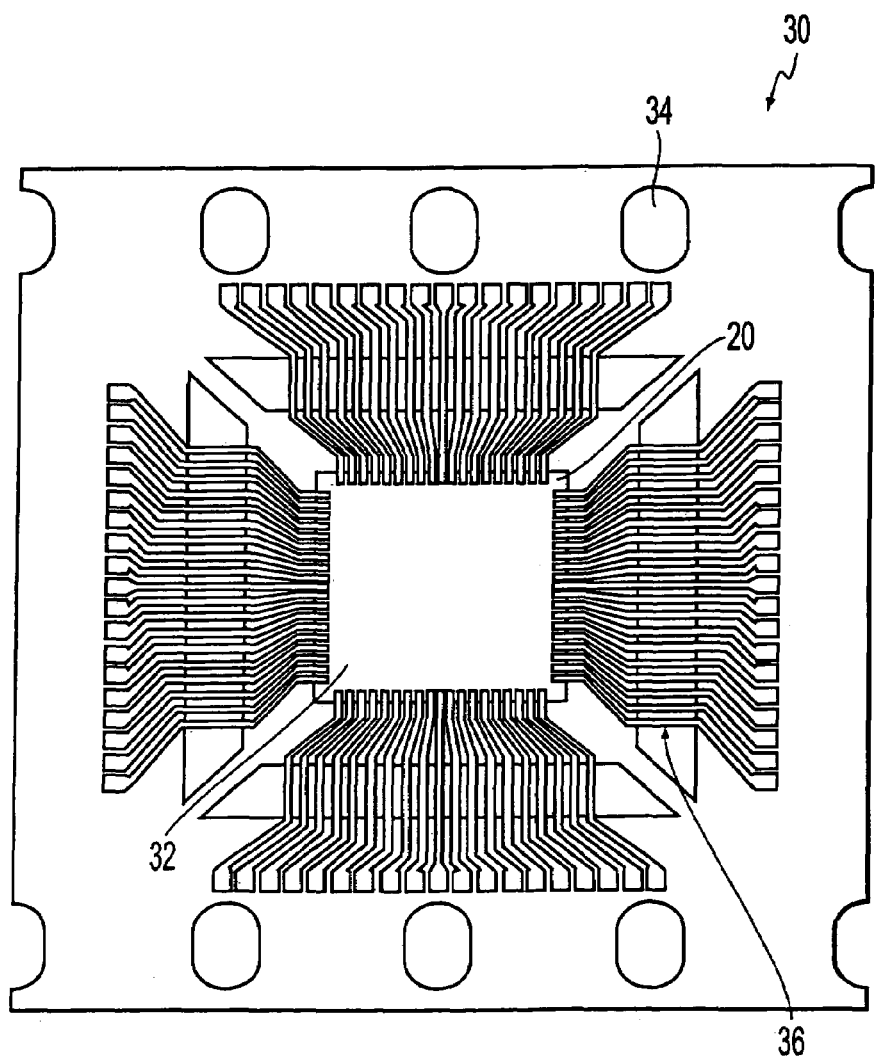
FIG. 5 is a schematic view of a film tape carrier.

FIG. 1 includes illustrative views of a method for making a semiconductor device in accordance with an embodiment of the present invention, wherein FIG. 1(1) is an illustrative view of the semiconductor chip before roughening a bump of a semiconductor chip, and FIG. 1(2) is an illustrative view after roughening. Moreover, FIG. 2 is an illustrative view of a bump after roughening treatment. FIG. 3 is an illustrative chart showing the relationship between the height of the prominence and the bonding strength of the bump and the inner lead.

In this embodiment, prominences are formed on the upper face of the bump to increase the surface area of the upper face so that the Au/Sn eutectic alloy is readily formed by thermal welding using a gang bonding apparatus.

FIG. 1(1) shows a halfway stage of the wafer process. A passivation film 44 is formed on a semiconductor wafer 50 that is provided with a semiconductor chip in a region other than an electrode pad 42. A barrier metal layer 48 is formed over the passivation film 44 and the electrode pad 42 above the entire semiconductor wafer 50. The barrier metal layer 48 includes two sub-layers. That is, a TiW sub-layer 48a is formed by sputtering on the passivation film 44, and then an Au sub-layer 48b is formed by plating on the TiW sub-layer 48a.

Next, a bump 10 is formed on the electrode pad 42. The bump 10 is formed by applying a photoresist on the entire surface of the semiconductor wafer 50, and by removing the photoresist in a bump-forming portion by exposure and development to form an opening, and then by plating Au in the opening. The upper face of the bump 10 in this stage is slightly indented in the central portion, as described above with reference to FIG. 3.

In this embodiment, the semiconductor wafer 50 is etched using a potassium iodide or ammonium iodide solution. The etching, as shown in FIG. 1(2), removes the barrier metal layer 48 and roughens the upper face of the bump 10 to form many prominences 12. The surface area of the bump 10 significantly increases compared to the surface area before etching. The difference in height between the periphery and the central portion of the bump 10 is considerably decreased due to the formation of the prominences 12.

Figure 6:
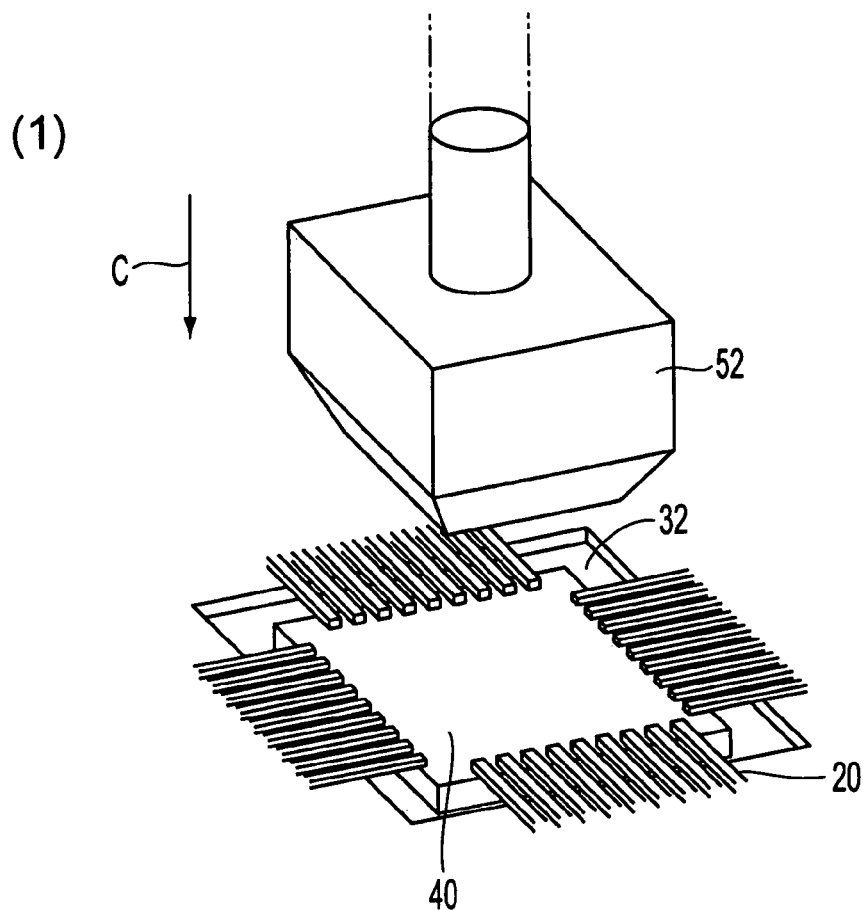
FIG. 6 includes illustrative views of a method for thermally welding a bump of a semiconductor chip to an inner lead of a film tape carrier, wherein FIG. 6(1) is an illustrative view of a state of the bump and the inner lead before thermal welding, and FIG. 6(2) is an illustrative view of a state of the bump and the inner lead after thermal welding.
Figure 6:
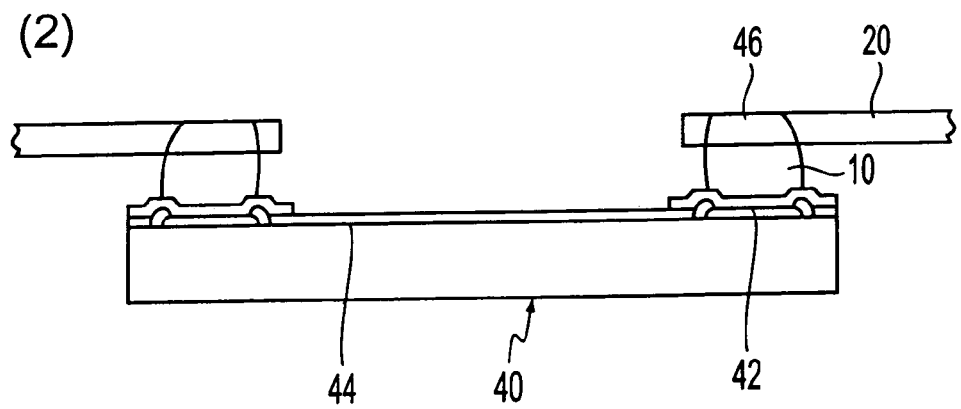

When the bump 10 and the inner lead 20 are thermally welded using the heating unit 52, as shown in FIG. 6(1), the area contributing to the formation of the Au/Sn eutectic alloy significantly increases, and the formation of the eutectic alloy is facilitated. In addition, the melt eutectic alloy penetrates the gap of the prominences 12 by a capillary phenomenon and adheres onto sloping faces 14 of the prominences 12 so as to enhance the bonding between the bump 10 and the inner lead 20. Thus, the bonding between the bump 10 and the inner lead 20 can be ensured even if the heating unit 52 is set at a lower temperature compared to conventional temperatures. Moreover, the difference in the height on the upper face of the bump 10 is considerably decreased. Hence, the pressure of the heating unit 52 can be reduced compared to the conventional cases.

The etching solution may be a solution containing an iodine compound or any compound other than potassium iodide and ammonium iodide, as long as the solution exhibits etching ability. Instead of Au, the bump 10 may be formed of any material, such as Ni, in which Au is adhered to the surface of the prominence. The prominences 12 may be formed by a mechanical process, if possible, for example, by pressing the upper face of the bump 10 using a tool having an uneven surface or by buffing the upper face of the bump 10 using such a tool. According to the mechanical process, the heights of the prominences can be controlled within a predetermined range, and the formation of the Au/Sn eutectic alloy is further facilitated for the reasons described below.

The height of the prominence 12 depends on the type of the etching solution used and the etching time. As shown in FIG. 2, individual heights are also different, as shown by the lowest prominence 12a and the highest prominence 12b. It is preferable that the difference in the height be small as much as possible, because the formation of the An/Sn eutectic alloy is promoted in proportion to the contact area during thermal welding between the bump and the inner lead. In the case of a large difference in the height of the prominences 12, prominences having lower heights are still distant from the inner lead and thus do not contribute to the formation of the Au/Sn eutectic alloy, even when the inner lead is pressed by the heating unit.

Experimental results have been prepared regarding the heights of the prominences 12, wherein the height A of the lowest prominence is 1 μm or more, and the height B of the highest prominence is less than 5 μm. The experimental results will now be described.

The present inventor has performed experiments regarding the relationship between the heights of the prominences and the bonding strength of the bump and the inner lead, and has obtained the data confirming the effects. The results will now be described based on FIG. 3.

Term 1 in the table represents the surface roughness of the bump, that is, the heights of the prominences on the upper face of the bump. The description "0 to less than 1" represents all the heights of the prominences lie within the range of 0 to 1. Term 2 represents the state of the formation of the Au/Sn eutectic alloy, in which ○ indicates that the formation is satisfactory, Δ indicates that the formation is not so satisfactory, and X indicates that the formation is unsatisfactory. Item 3 represents the bonding strength between the bump and the inner liner, in which ○ indicates that reliable strength is obtained, Δ indicates that strength is slightly insufficient, and X indicates that strength is insufficient. Item 4 represents the comprehensive determination, in which ○ indicates that the reliable results are obtainable in the semiconductor device, Δ indicates that the slightly unreliable results are obtainable in the semiconductor device, and X indicates that the unreliable results are obtainable in the semiconductor device.

As shown in chart, the height of the most preferable height of the prominence is within a range of 1 μm to less than 5 μm. A height of the prominence of 0 μm to less than 1 μm is not substantially different from a flat face of the bump, and thus, advantages by providing the prominence are insufficient. A height of prominence of 5 μm or more results in a large distance between the base portion of the prominence and the inner lead. Thus, the melted Au/Sn eutectic alloy is not adhered to the vicinity of the base portion of the prominence and will not contribute to an improvement in bonding strength.

As described above, in the semiconductor device and the method for making the same in accordance with the embodiments of the present invention, the upper face of the bump of the semiconductor chip is roughened to form prominences. If the temperature and the pressure of the heating unit are set to be lower than those in conventional processes, sufficient bonding strength is achieved between the bump and the inner lead. Since the removal of the barrier metal and the roughening of the upper face of the bump are simultaneously performed, no additional step is required.

As described above, a semiconductor device in accordance with the invention includes a tape substrate provided with a lead, and a semiconductor chip mounted onto the tape substrate by thermal welding a bump formed on an active face of the semiconductor chip with the lead. Thus, reliability of the bonding between the semiconductor chip and the tape substrate can be significantly improved by a simplified treatment in a wafer process. Accordingly, the production cost of the semiconductor device can be reduced.

What is claimed is:

1. A semiconductor chip, comprising:
   a tape substrate provided with a lead; and
   a semiconductor chip that includes an active face and a bump formed on the active face, the bump having an upper face, the semiconductor chip being mounted onto the tape substrate, the bump formed on the active face of the semiconductor chip with the lead of the tape substrate, the upper face of the bump being roughened, thereby forming a plurality of prominences on the upper face of the bump, the prominences having a height of from 1–3 μm.

2. The semiconductor chip according to claim 1, wherein each of the prominences includes sloping faces that define a substantially rounded tip.

3. The semiconductor chip according to claim 2, wherein sloping faces of adjacent prominences define substantially rounded channels, each substantially rounded channel separating adjacent prominences.

4. The semiconductor chip according to claim 1, wherein the semiconductor chip includes a semiconductor wafer.

5. The semiconductor chip according to claim 4, wherein the semiconductor chip includes a passivation film and a barrier metal layer disposed between the semiconductor wafer and the bump.

6. The semiconductor chip according to claim 5, wherein the barrier metal layer includes an Au sub-layer and a TiW sub-layer.

7. The semiconductor chip according to claim 6, wherein the semiconductor chip includes an electrode pad disposed between the semiconductor wafer and the barrier metal layer.

8. The semiconductor chip according to claim 7, wherein the barrier metal layer is only disposed between the bump and the semiconductor wafer so as not to project laterally from the bump.

* * * * *